(12) United States Patent
Chiu et al.

(10) Patent No.: US 12,183,608 B2
(45) Date of Patent: Dec. 31, 2024

(54) SUBSTRATE CONTAINER WITH ENHANCED FLOW FIELD THEREIN

(71) Applicant: GUDENG PRECISION INDUSTRIAL CO., LTD., New Taipei (TW)

(72) Inventors: Ming-Chien Chiu, New Taipei (TW); En-Nien Shen, New Taipei (TW); Yung-Chin Pan, New Taipei (TW); Chih-Ming Lin, New Taipei (TW); Wei-Chien Liu, New Taipei (TW); Cheng-En Chung, New Taipei (TW); Po-Ting Lee, New Taipei (TW); Jyun-Yan Jiang, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 326 days.

(21) Appl. No.: 17/197,064

(22) Filed: Mar. 10, 2021

(65) Prior Publication Data
US 2022/0093437 A1 Mar. 24, 2022

Related U.S. Application Data

(60) Provisional application No. 63/081,902, filed on Sep. 22, 2020.

(51) Int. Cl.
*H01L 21/673* (2006.01)
*B65D 21/02* (2006.01)
(Continued)

(52) U.S. Cl.
CPC .... *H01L 21/67309* (2013.01); *B65D 21/0204* (2013.01); *B65D 21/0213* (2013.01);
(Continued)

(58) Field of Classification Search
CPC .................................................. H01L 21/67393
See application file for complete search history.

(56) References Cited

U.S. PATENT DOCUMENTS

| 2015/0357218 A1* | 12/2015 | Lin | ................... H01L 21/67393 |
| | | | 137/574 |
| 2019/0206708 A1* | 7/2019 | Woo | ................... H01L 21/67393 |
| 2019/0393063 A1* | 12/2019 | Matsutori | ......... H01L 21/67389 |

FOREIGN PATENT DOCUMENTS

| TW | I567856 B | 1/2017 |
| TW | M588108 U | 12/2019 |

* cited by examiner

*Primary Examiner* — Allan D Stevens

(57) ABSTRACT

A substrate container with enhanced flow field therein includes a box, at least one offset inflation mechanism and at least one gas diffusion mechanism. The offset inflation mechanism is disposed outside internal receiving space of the box. The offset inflation mechanism has a gaseous chamber extending in the same direction as a bottom panel. The gas diffusion mechanism includes a base, a partition wall and at least one diffusion member. The base masks an outlet of the gaseous chamber to form an auxiliary gaseous chamber. The partition wall extends perpendicularly to the bottom panel to form a vertical first gas channel in communication with the auxiliary gaseous chamber. The diffusion member and the partition wall together define a second gas channel. The partition wall has at least one gap whereby the first gas channel and the second gas channel are in communication with each other.

7 Claims, 8 Drawing Sheets

(51) Int. Cl.
  *B65D 21/08* (2006.01)
  *B65D 25/10* (2006.01)
  *B65D 47/32* (2006.01)
  *H01L 21/67* (2006.01)
  *H01L 21/677* (2006.01)
(52) U.S. Cl.
  CPC ....... *B65D 21/0228* (2013.01); *B65D 21/083* (2013.01); *B65D 25/107* (2013.01); *B65D 47/32* (2013.01); *H01L 21/67017* (2013.01); *H01L 21/67346* (2013.01); *H01L 21/67373* (2013.01); *H01L 21/67393* (2013.01); *H01L 21/67742* (2013.01); *B65D 2205/02* (2013.01); *B65G 2201/0235* (2013.01); *B65G 2201/0297* (2013.01)

SUBSTRATE CONTAINER WITH ENHANCED FLOW FIELD THEREIN

CROSS-REFERENCE TO RELATED APPLICATION

This non-provisional application claims priority under 35 U.S.C. § 119(e) on U.S. provisional Patent Application Ser. No. 63/081,902 filed on Sep. 22, 2020, the entire contents of which are hereby incorporated by reference.

BACKGROUND OF THE INVENTION

1. Field of the Invention

The present disclosure relates to substrate containers, and in particular to a substrate container with enhanced flow field therein.

2. Description of the Related Art

In the manufacturing field, substrates (for example, wafers, glass substrates, circuit boards, or substrates of any other types) undergo multiple processes and are placed in a substrate container for the purpose of storage and transportation during intervening time periods. Thus, cleanliness of substrate containers is important. Furthermore, the odds are that remaining moisture, dust and residual heat may exist on the surfaces of the substrates processed and stored in a substrate container. Related prior art discloses blowing air from the bottom of the rear (relative to the front for opening and shutting the substrate container) of the substrate container toward the interior thereof, such that gaseous current flows from the rear of the substrate container to the front of the substrate container, taking away the remaining moisture, dust and residual heat, using, for example, a blow-clean module of a wafer delivery device of Taiwan patent 1567856. However, the gas flow field is mostly present in the vicinity of the bottom of the substrate container, but the gas current above the first piece of substrate is very weak or even stalls. Furthermore, special gas channels may be provided in order to enhance the flow field, though at the cost of taking up storage space of the substrate container. The resultant reduction in the available storage space of the substrate container causes a decrease in the number of substrates to be stored in the substrate container, leading to elevated substrate storage cost.

BRIEF SUMMARY OF THE INVENTION

An objective of the present disclosure is to provide a substrate container with enhanced flow field therein.

To achieve at least the above objective, the present disclosure provides a substrate container with enhanced flow field therein, comprising: a box having a front cover and a back panel opposing the front cover, a bottom panel connecting the front cover and the back panel, and a top panel connecting the front cover and the back panel, wherein the front cover, the back panel, the bottom panel and the top panel together define an internal receiving space; at least one offset inflation mechanism disposed outside the internal receiving space and having a gaseous chamber extending in the same direction as the bottom panel, wherein an inlet is disposed at an end of the gaseous chamber, wherein the inlet and the box are disposed on two opposing sides of the gaseous chamber, respectively, wherein at least one outlet penetrating the bottom panel is disposed at another end of the gaseous chamber, wherein the at least one outlet is positioned proximate to the back panel; and at least one gas diffusion mechanism adjoining the back panel and comprising a base, a partition wall and at least one diffusion member, wherein the base masks the at least one outlet to thereby form an auxiliary gaseous chamber, wherein the partition wall extends perpendicularly to the bottom panel to thereby form a vertical first gas channel, wherein the first gas channel is in communication with the auxiliary gaseous chamber, wherein the at least one diffusion member is disposed on at least one side of the partition wall, wherein the diffusion member and the partition wall together define a second gas channel, wherein the partition wall has at least one gap whereby the first gas channel and the second gas channel are in communication with each other.

In an embodiment of the present disclosure, the second gas channel and the auxiliary gaseous chamber are not in direct communication with each other.

In an embodiment of the present disclosure, a plurality of through holes are disposed on the diffusion member and facing the front cover, such that gas from the first gas channel goes to the front cover via the through holes.

In an embodiment of the present disclosure, the partition wall and the diffusion member are integrally formed.

In an embodiment of the present disclosure, the at least one gap is disposed between the partition wall and the back panel.

In an embodiment of the present disclosure, the substrate container with enhanced flow field therein further comprises a central support mechanism, wherein the offset inflation mechanisms are in the number of two, wherein the gas diffusion mechanisms are in the number of two, wherein the central support mechanism is disposed between the two gas diffusion mechanisms.

In an embodiment of the present disclosure, the partition wall and the back panel are integrally formed.

In an embodiment of the present disclosure, the at least one gap is disposed between the partition wall and the diffusion member.

In an embodiment of the present disclosure, the substrate container with enhanced flow field therein further comprises an airtight member disposed between the partition wall and the box.

In an embodiment of the present disclosure, the back panel, the partition wall and the diffusion member are integrally formed, and the gap penetrates the partition wall.

Hence, the present disclosure provides the substrate container with enhanced flow field therein, such that in the height direction a strong gaseous current flows from behind the box to the front cover, and thus the flow field in the box is enhanced greatly rather than is confined to the bottom of the box, thereby taking away remaining moisture, dust and residual heat and maintaining the quality of substrates. In addition, with the flow field being enhanced, the offset inflation mechanism and gas diffusion mechanism do not take up substrate storage space.

DETAILED DESCRIPTION OF THE INVENTION

To facilitate understanding of the object, characteristics and effects of this present disclosure, embodiments together with the attached drawings for the detailed description of the present disclosure are provided.

Figure 1:
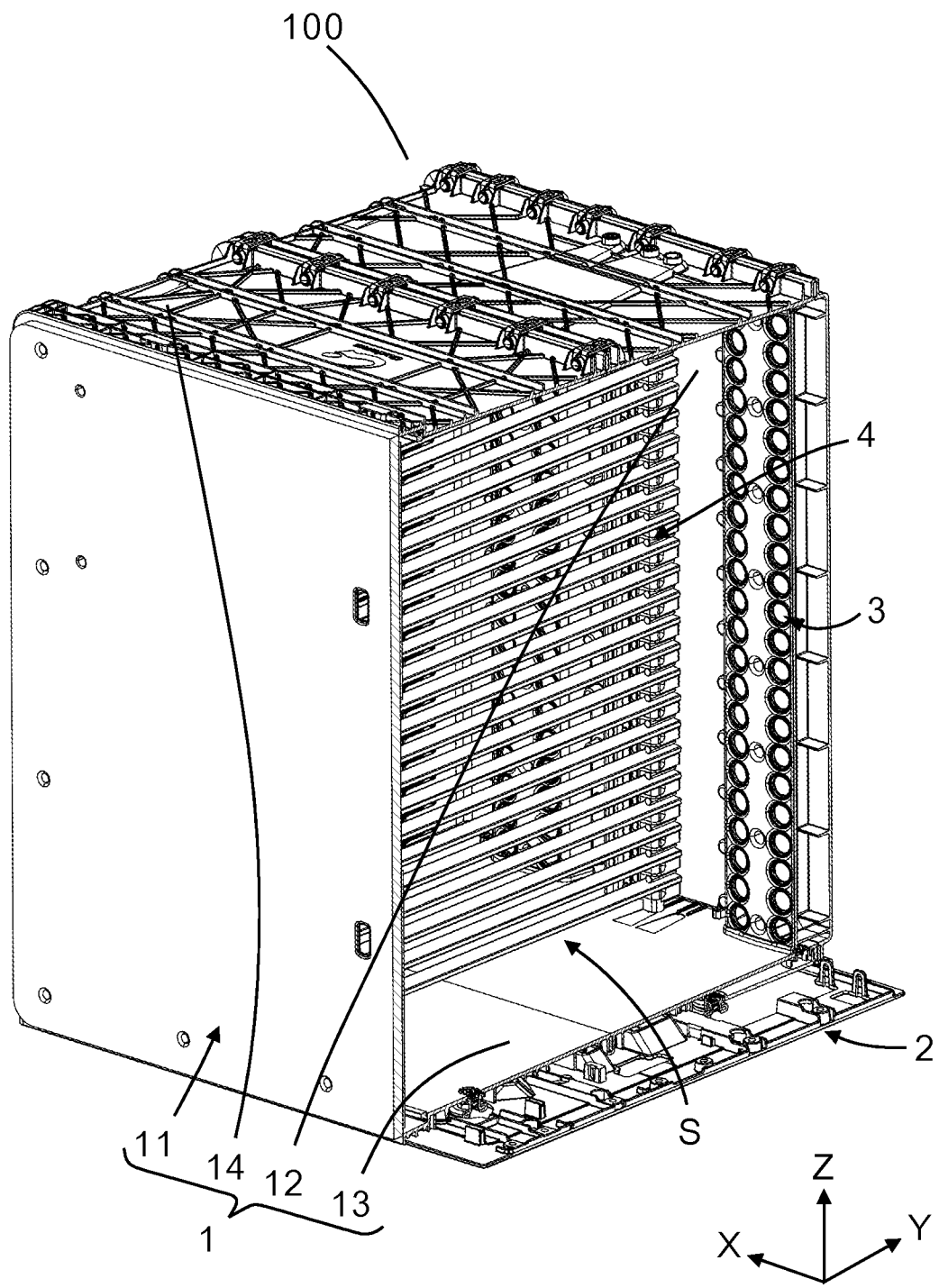
FIG. 1 is a cutaway view of a substrate container with enhanced flow field therein according to the first embodiment of the present disclosure.

Referring to FIG. 1, in the first embodiment of the present disclosure, a substrate container 100 with enhanced flow field therein comprises a box 1, at least one offset inflation mechanism 2 and at least one gas diffusion mechanism 3.

The box 1 has a front cover 11, a back panel 12 opposing the front cover 11, a bottom panel 13 connecting the front cover 11 and the back panel 12, and a top panel 14 connecting the front cover 11 and the back panel 12. The box 1 further has a plurality of lateral panels (not shown). The front cover 11, the back panel 12, the bottom panel 13 and the top panel 14 define an internal receiving space S.

Figure 2:
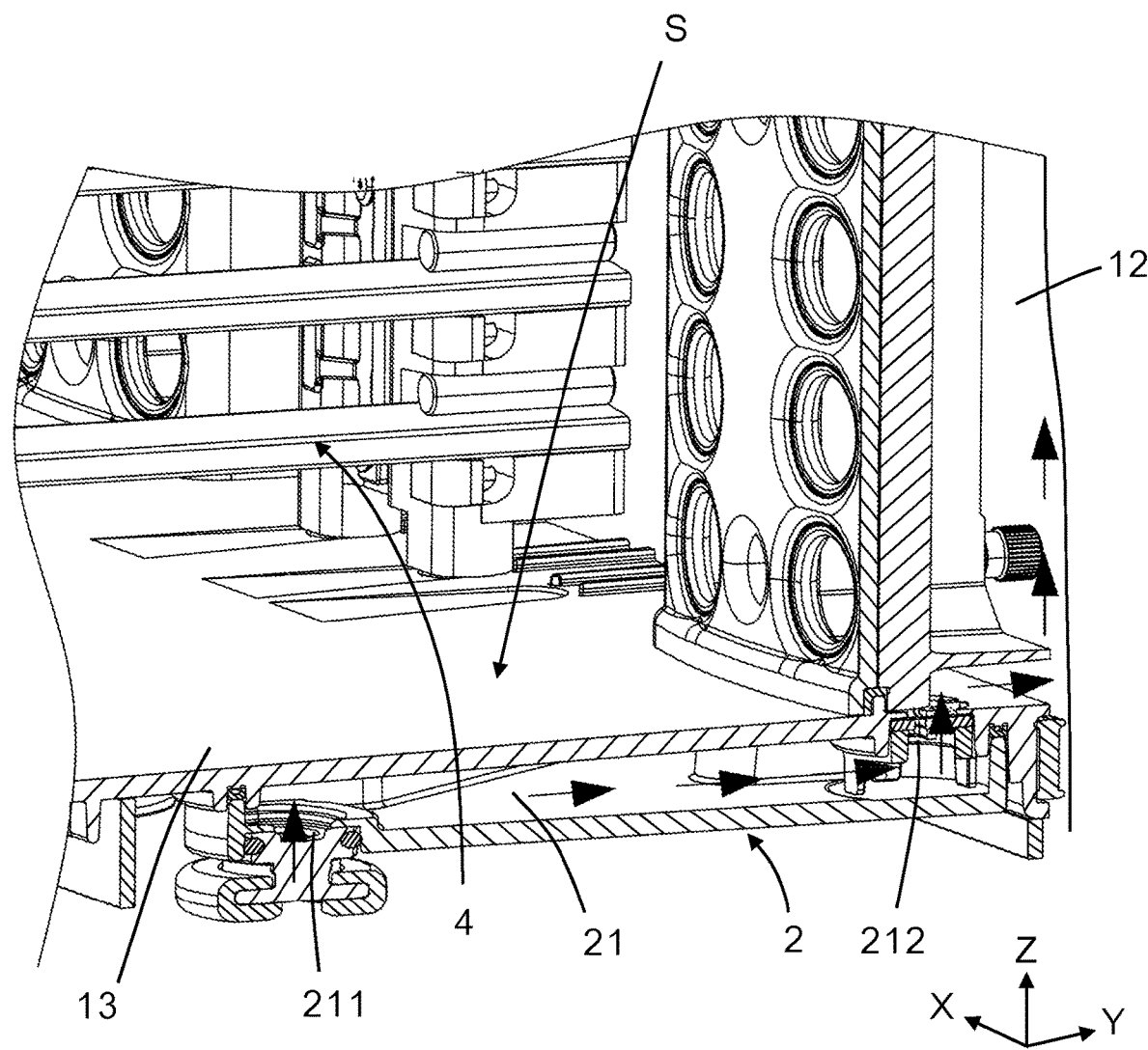
FIG. 2 is a cutaway view of the substrate container with enhanced flow field therein according to the first embodiment of the present disclosure.
Figure 3:
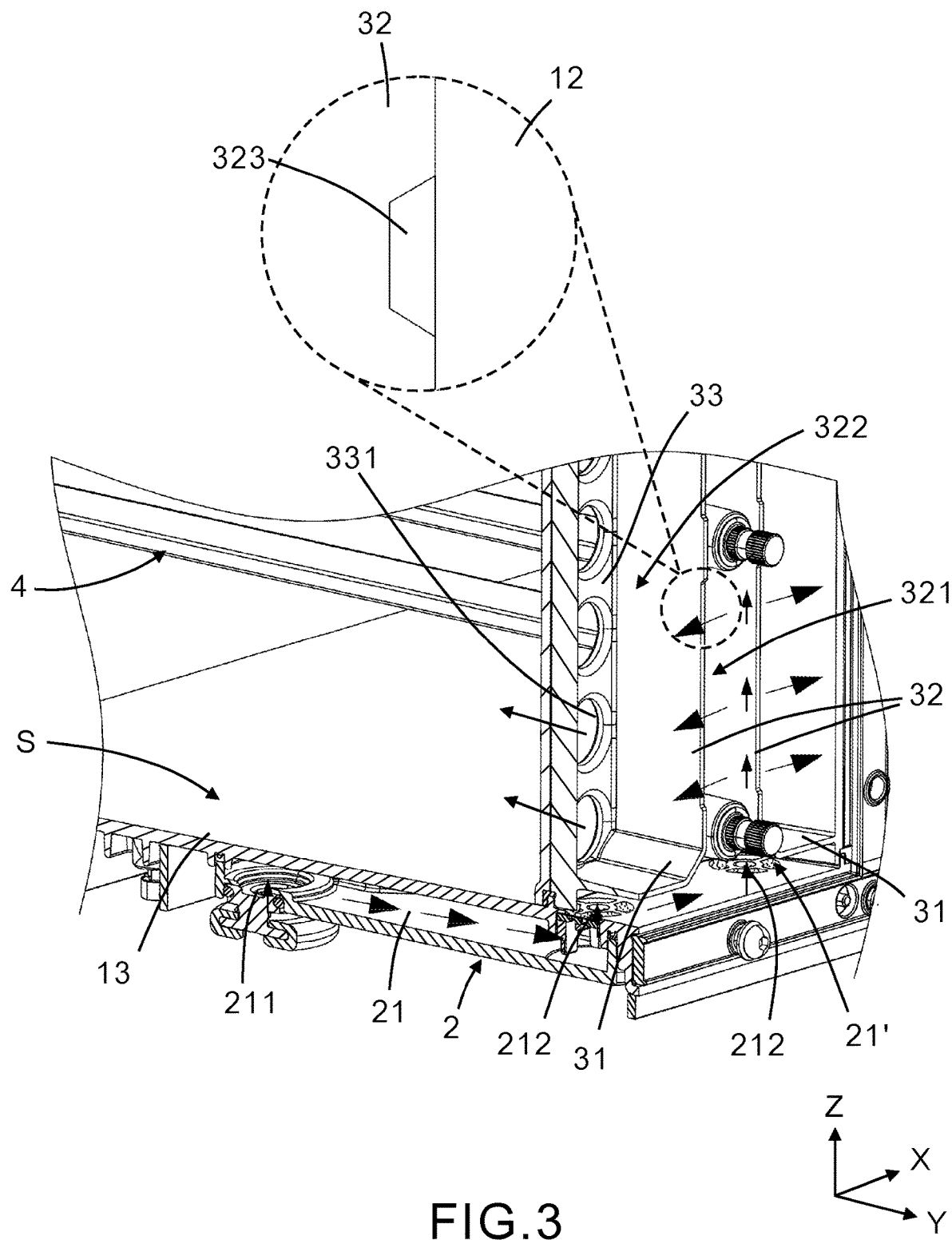
FIG. 3 is a cutaway view based on FIG. 2 and taken from another angle.

Referring to FIG. 1 through FIG. 3 (FIG. 3 omits the back panel 12), an offset inflation mechanism 2 is disposed outside the internal receiving space S. The offset inflation mechanism 2 has a gaseous chamber 21 extends in the same direction as the bottom panel 13. One end of the gaseous chamber 21 has an inlet 211. The inlet 211 and the box 1 lie on two opposing sides of the gaseous chamber 21, respectively. The inlet 211 admits a pressurized gas. The inlet 211 is a gas quick-connection adaptor. The pressurized gas is introduced into the gaseous chamber 21 with a blow-clean module of a wafer delivery device of Taiwan patent 1567856. At least one outlet 212 penetrating the bottom panel 13 is disposed at the other end of the gaseous chamber 21. The outlet 212 is positioned proximate to the back panel 12.

The gas diffusion mechanism 3 adjoins the back panel 12. The gas diffusion mechanism 3 comprises a base 31, a partition wall 32 and at least one diffusion member 33. The base 31 masks the outlet 212 and thus forms an auxiliary gaseous chamber 21'. The partition wall 32 extends perpendicularly to the bottom panel 13 and thereby forms a vertical first gas channel 321. The first gas channel 321 is in communication with the auxiliary gaseous chamber 21'. In this embodiment, the gaseous chamber 21 has two outlets 212, and the base 31 masks the two outlets 212 to thereby form an auxiliary gaseous chamber 21'. The outlets 212 enable the pressurized gas to evenly enter the auxiliary gaseous chamber 21' via the gaseous chamber 21, such that the gaseous chamber 21 and the auxiliary gaseous chamber 21' have therein substantially equal, high pressure relative to the pressure in the internal receiving space S. However, the aforesaid technical feature is not restrictive of the present disclosure, as the outlets 212 may be in the number of one or more and may be made of a porous material.

Figure 4:
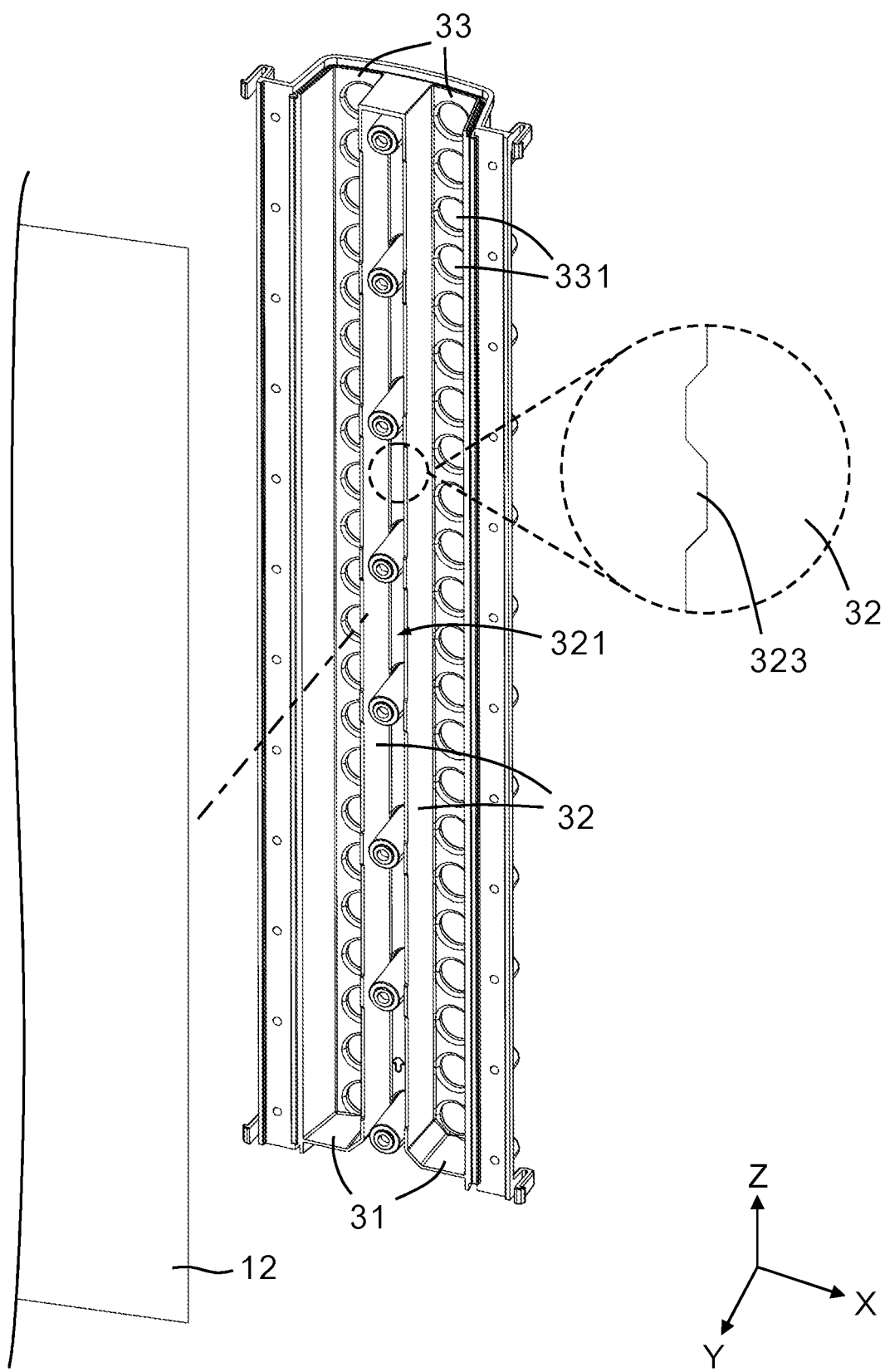
FIG. 4 is a perspective view of gas diffusion mechanism according to the first embodiment of the present disclosure.

Referring to FIG. 3 and FIG. 4, at least one diffusion member 33 is disposed on at least one side of the partition wall 32. The diffusion member 33, the partition wall 32, and the back panel 12 together define a second gas channel 322. Thus, the first gas channel 321 and the second gas channel 322 extend in an arrangement direction and are disposed side by side and separated by the partition wall 32. The partition wall 32 has at least one gap 323 whereby the first gas channel 321 and the second gas channel 322 are in communication with each other. In this embodiment, the second gas channel 322 and the auxiliary gaseous chamber 21' are not in direct communication with each other. The second gas channel 322 is in communication with the internal receiving space S via the diffusion member 33.

Therefore, after the auxiliary gaseous chamber 21' of the back panel 12 has been filled with the pressurized gas via the gaseous chamber 21, the pressure in the auxiliary gaseous chamber 21' is high, and the first gas channel 321 is the only path leading to the auxiliary gaseous chamber 21', thereby allowing the pressurized gas to enter the first gas channel 321 quickly. Since the gap 323 between the first gas channel 321 and second gas channel 322 is small, the gas leaking through the gap 323 does not have any significant effect on the pressure in the first gas channel 321. Thus, with the pressurized gas being continuously introduced, the pressure in the first gas channel 321 is high relative to that in the internal receiving space S. However, the aforesaid technical features are not restrictive of the present disclosure.

The pressurized gas exits the first gas channel 321 and then enters the second gas channel 322 via the gaps 323. Preferably, the gaps 323 are aligned in the height direction (Z-axis direction), starting from the bottom of the first gas channel 321. Since the first gas channel 321 is of high pressure in the height direction, even at the top of the first gas channel 321, the pressurized gas exits the gaps 323 and enters the second gas channel 322 to thereby generate strong gaseous current. Thus, since the second gas channel 322 and auxiliary gaseous chamber 21' are not in direct communication with each other, receives gas from the first gas channel 321, and the gas diffuses to the internal receiving space S. In Z-axis direction, strong gaseous current flows from the first gas channel 321 to the internal receiving space S through the second gas channel 322 and blows toward the front cover 11, such that the flow field in the box 1 is enhanced greatly rather than confined to the vicinity of the bottom panel 13 near the inlet 211.

Referring to FIG. 3 and FIG. 4, in this embodiment, a plurality of through holes 331 are disposed on the diffusion member 33 and facing the front cover 11, such that gas from the first gas channel 321 flows to the internal receiving space S via the through holes 331. However, the aforesaid technical features are not restrictive of the present disclosure, as a surface of the diffusion member 33 faces the front cover 11 and is made of a porous material.

Referring to FIG. 4, in this embodiment, the diffusion members 33 are in the number of two and are disposed on two opposing sides of the partition wall 32.

Referring to FIG. 4, in this embodiment, the partition wall 32 and the diffusion members 33 are integrally formed, and the gaps 323 are disposed between the partition wall 32 and the back panel 12. However, the aforesaid technical feature is not restrictive of the present disclosure, the partition wall 32 and each diffusion member 33 are each self-contained and are adhered together or welded together or are kept airtight with any other airtight member.

In this embodiment, the offset inflation mechanisms 2 are in the number of two, and the gas diffusion mechanisms 3 are in the number of two. Referring to FIG. 1, a central support mechanism 4 is disposed between the two offset inflation mechanisms 2 and the gas diffusion mechanisms 3. The central support mechanism 4 is, for example, a rear support unit disclosed in Taiwan patent M588108 and adapted to support central areas of substrates on an auxiliary basis.

Figure 5:
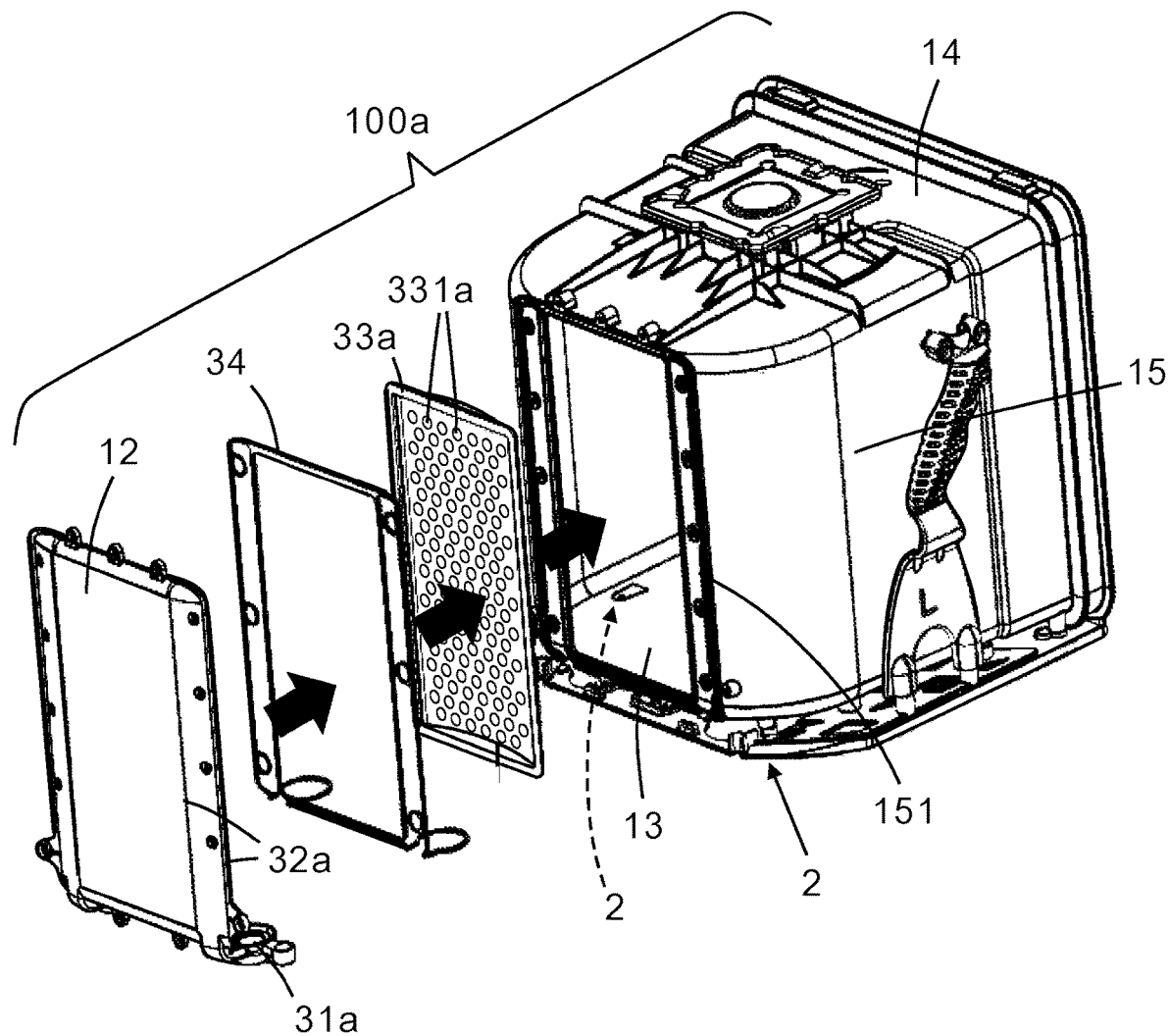
FIG. 5 is a schematic view of the substrate container with enhanced flow field therein according to the second embodiment of the present disclosure.
Figure 6:
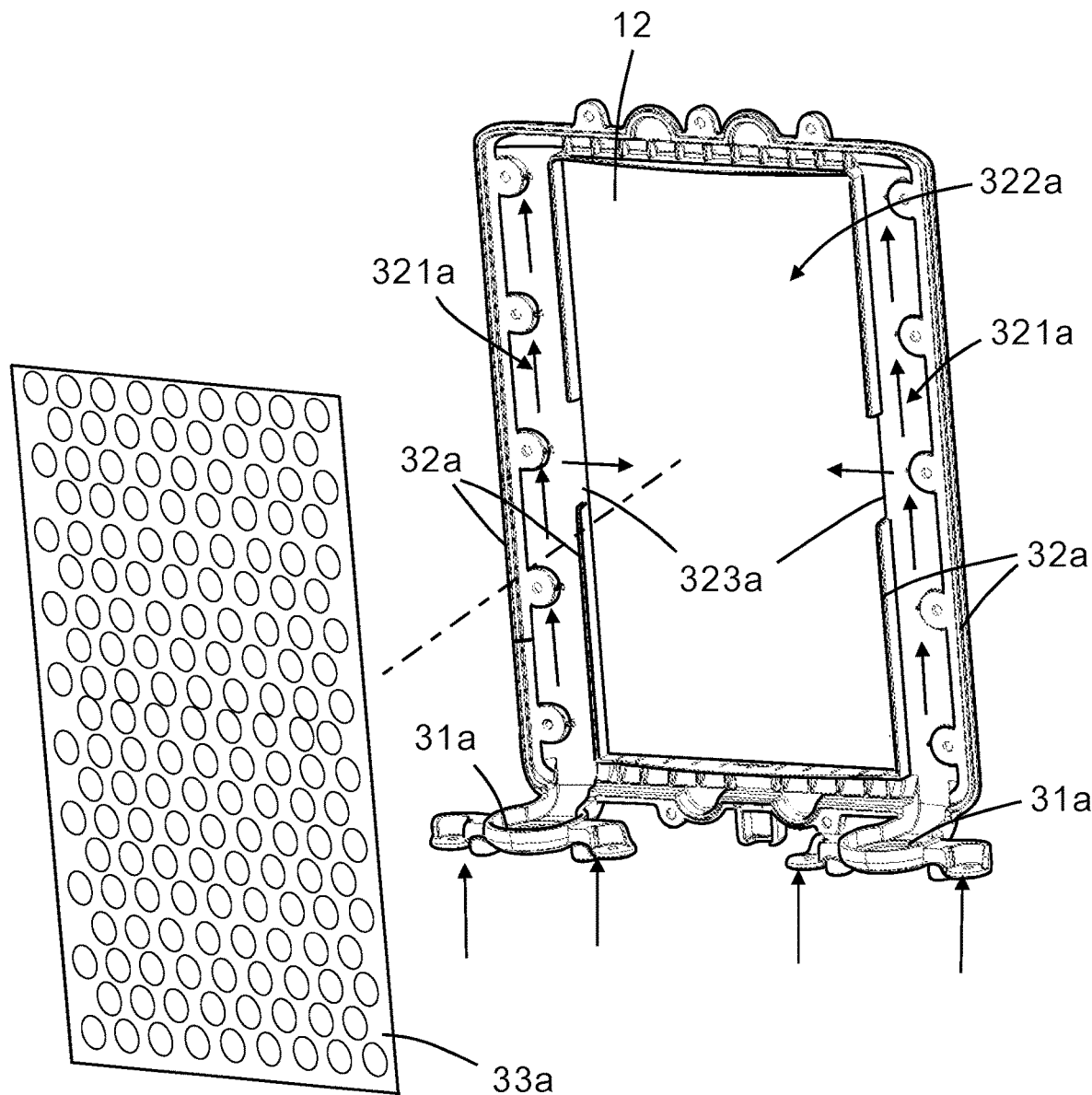
FIG. 6 is a perspective view of gas diffusion mechanism according to the second embodiment of the present disclosure.
Figure 7:
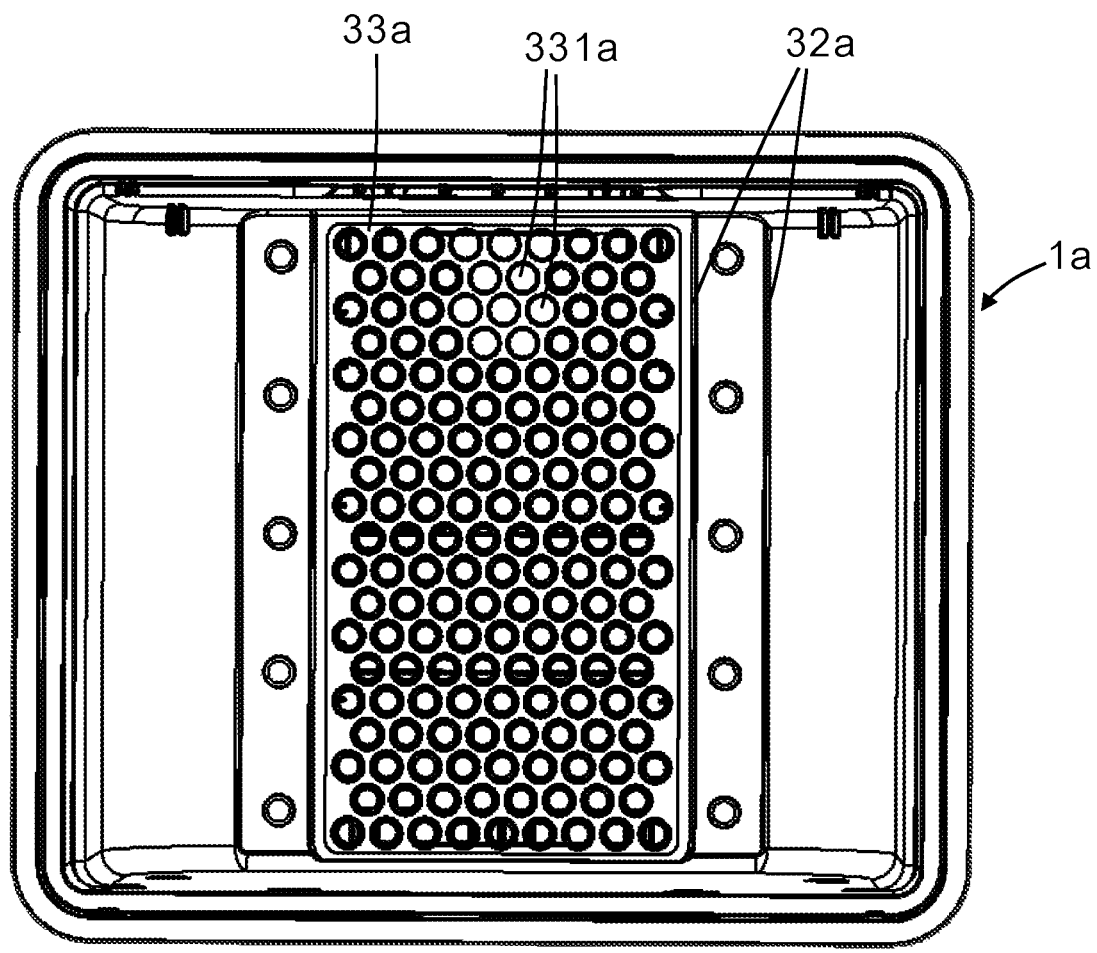
FIG. 7 is a front view of the substrate container with enhanced flow field therein according to the second embodiment of the present disclosure.

Referring to FIG. 5 through FIG. 7, the difference between the substrate container 100a with enhanced flow field therein in the second embodiment of the present disclosure and the substrate container 100 with enhanced flow field therein in the first embodiment of the present disclosure are described below. The offset inflation mechanism 2, the base 31a and the partition wall 32a of the substrate container 100a with enhanced flow field therein are each in a plural number. The diffusion member 33a connects to the partition walls 32a, such that the second gas channels 322a connect to a plurality of first gas channels 321a, respectively. In this embodiment, the offset inflation mechanisms 2, the bases 31a and the partition walls 32a are each in the number of two, and the two partition walls 32a are disposed at the two ends of the diffusion member 33a, respectively, such that the two ends of the second gas channel 322a are in communication with the two first gas channels 321a, respectively. However, the aforesaid technical feature is not restrictive of the present disclosure, as the present disclosure may also provide three or more partition walls 32a disposed along a plurality of edges of the diffusion member 33a.

In this embodiment, the partition walls 32a and the back panel 12 are integrally formed, whereas the base 31a is integrally formed with the partition walls 32a and the back panel 12.

The box 1a has lateral panels 15. Extension portions 151 of the lateral panels 15 and the partition walls 32a together define the first gas channels 321a. The extension portions 151 may also be regarded as parts of the back panel connected to the lateral panels 15.

Likewise, the pressurized gas exits the outlet of the offset inflation mechanism 2 and not only enters the base 31a and the bottom panel 13 to form an auxiliary gaseous chamber but also enters the first gas channel 321a defined by the partition walls 32a and the extension portions 151. The pressurized gas passes through the gap 323a to generate strong gaseous current. The strong gaseous current enters the second gas channel 322a jointly defined by the back panel 12, the partition walls 32a and the diffusion members 33a. Then, the strong gaseous current flows to the front cover via a plurality of said through holes 331a.

Referring to FIG. 5, in this embodiment, the substrate container 100a with enhanced flow field therein further comprises an airtight member 34 disposed between the partition walls 32a and the extension portions 151 to maintain the airtightness between the partition walls 32a and the extension portions 151. The airtight member 34 is a silicone strip.

In this embodiment, the partition walls 32a and the back panel 12 are integrally formed, and the gaps 323a are disposed between the partition walls 32a and the diffusion members 33a. However, the aforesaid technical features are not restrictive of the present disclosure.

Figure 8:
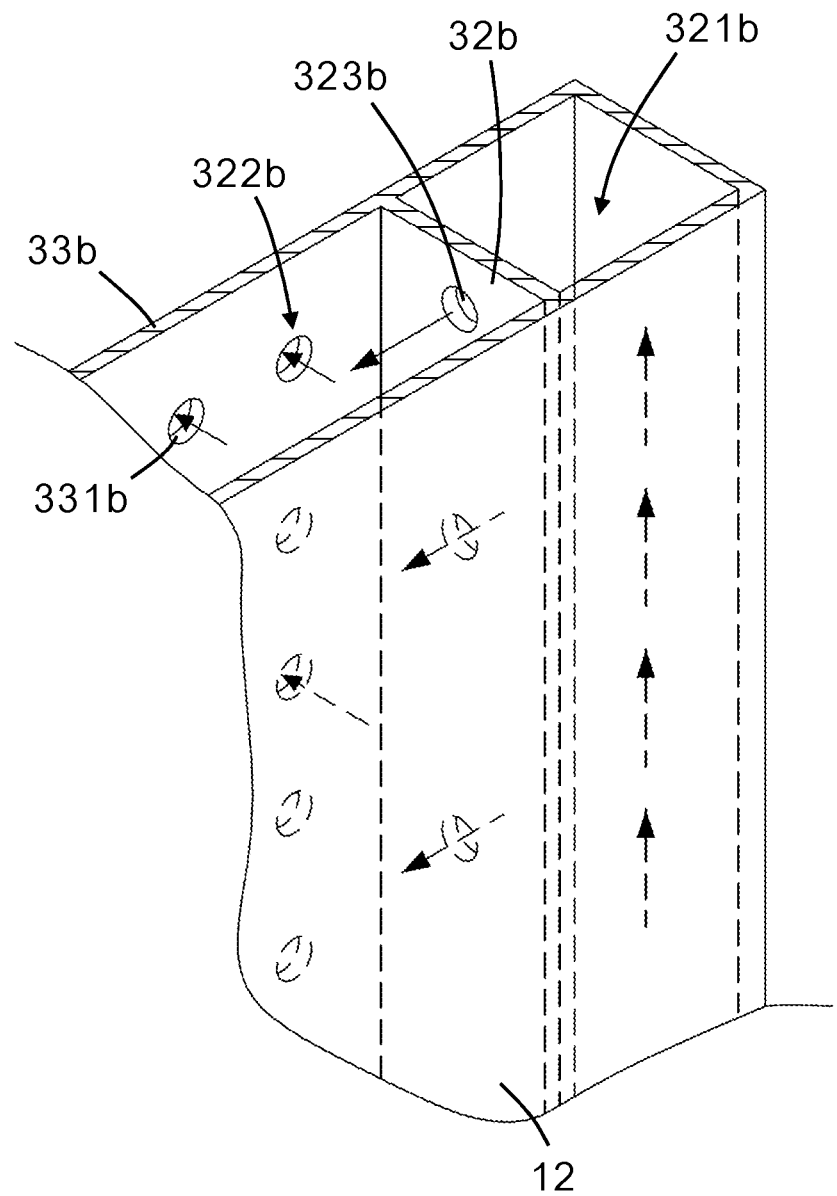
FIG. 8 is a cutaway view of a partition wall according to the third embodiment of the present disclosure.

Referring to FIG. 8, in the third embodiment of the present disclosure, the back panel 12, the partition walls 32b and the diffusion members 33b are integrally formed (or are kept airtight by any other means). The gaps 323b penetrate the partition walls 32b but are not disposed between the partition walls 32b. The pressurized gas exits the first gas channel 321b and enters the second gas channel 322b via the gaps 323b. Then, the pressurized gas flows to the front cover through the through holes 331b of the diffusion members 33b. The gaps 323b are made of a porous material.

While the present disclosure has been described by means of specific embodiments, numerous modifications and variations could be made thereto by those skilled in the art without departing from the scope and spirit of the present disclosure set forth in the claims.

What is claimed is:

1. A substrate container with enhanced flow field therein, comprising:
   a box having a front cover and a back panel opposing the front cover, a bottom panel connecting the front cover and the back panel, and a top panel connecting the front cover and the back panel, wherein the front cover, the back panel, the bottom panel and the top panel together define an internal receiving space;
   at least one offset inflation mechanism disposed outside the internal receiving space and having a gaseous chamber extending in the same direction as the bottom panel, wherein an inlet is disposed at an end of the gaseous chamber, wherein the inlet and the box are disposed on two opposing sides of the gaseous chamber, respectively, wherein plural outlets penetrating the bottom panel are disposed at another end of the gaseous chamber, wherein the plural outlets are positioned proximate to the back panel; and
   at least one gas diffusion mechanism adjoining the back panel and comprising two a-bases, two partition walls and two diffusion members, wherein the two bases masks the plural outlets to thereby form an auxiliary gaseous chamber, the gaseous chamber and the auxiliary gaseous chamber are separated by the bottom panel, wherein the two partition walls extends perpendicularly to the bottom panel and a vertical first gas channel is formed at least partially by the two partition walls, wherein the first gas channel is in communication with the auxiliary gaseous chamber, wherein the two diffusion members are respectively disposed on at least one side of the two partition walls, wherein a first one of the two second gas channels is formed by a first of the two diffusion members and a first of the two partition walls, wherein a second of the two second gas channels is formed by a second of the two diffusion members and a second of the two partition walls, wherein one of the two partition walls has a gap whereby the first gas channel and one of the two second gas channels are in communication with each other,
   wherein, an arrangement direction of the first gas channel and the two second gas channels is parallel to a surface of the back panel, the first gas channel and the two second gas channels are distributed in parallel and adjacent to the back panel, and a first of the two second gas channels is arranged on an opposite side of the first gas channel from a second of the two second gas channels.

2. The substrate container with enhanced flow field therein according to claim 1, wherein each of the two second gas channels and the auxiliary gaseous chamber are not in direct communication with each other.

3. The substrate container with enhanced flow field therein according to claim 1, wherein a surface of the two diffusion members facing the front cover has a plurality of through holes, such that gas from the first gas channel goes to the front cover via the through holes.

4. The substrate container with enhanced flow field therein according to claim 1, wherein the two partition walls and the two diffusion members are integrally formed.

5. The substrate container with enhanced flow field therein according to claim 1, wherein the gap is disposed between one of the two partition walls and the back panel.

6. The substrate container with enhanced flow field therein according to claim 1, wherein the two partition walls and the back panel are integrally formed.

7. The substrate container with enhanced flow field therein according to claim 1, wherein the back panel, two partition walls and the two diffusion members are integrally formed, and the gap penetrates one of the two partition walls.

* * * * *